(12) United States Patent
Hsiao et al.

(10) Patent No.: US 11,532,913 B2
(45) Date of Patent: Dec. 20, 2022

(54) CABLE ASSEMBLY WITH IMPROVED HIGH FREQUENCY SIGNAL INTEGRITY AND INCREASE QUALITY WITH HIGH FREQUENCY SIGNAL TRANSMISSION

(71) Applicant: BizLink International Corp., New Taipei (TW)

(72) Inventors: Hsin-Tuan Hsiao, New Taipei (TW); Kuo-Yang Tsai, New Taipei (TW)

(73) Assignee: BizLink International Corp., New Taipei (TW)

( * ) Notice: Subject to any disclaimer, the term of this patent is extended or adjusted under 35 U.S.C. 154(b) by 867 days.

(21) Appl. No.: 16/372,439

(22) Filed: Apr. 2, 2019

(65) Prior Publication Data

US 2020/0127406 A1    Apr. 23, 2020

(30) Foreign Application Priority Data

Oct. 19, 2018 (TW) ................ 107137063

(51) Int. Cl.

| H01R 13/6474 | (2011.01) |
| H01R 13/02 | (2006.01) |
| H01R 9/03 | (2006.01) |
| H01R 12/62 | (2011.01) |
| H01B 11/00 | (2006.01) |
| H05K 1/02 | (2006.01) |
| H01R 12/77 | (2011.01) |

(Continued)

(52) U.S. Cl.
CPC ......... *H01R 13/6474* (2013.01); *H01B 11/00* (2013.01); *H01R 9/03* (2013.01); *H01R 12/62* (2013.01); *H01R 12/721* (2013.01); *H01R 12/771* (2013.01); *H01R 13/02* (2013.01); *H05K 1/0237* (2013.01); *H01R 13/502* (2013.01)

(58) Field of Classification Search
CPC .... H01R 12/62; H01R 12/721; H01R 12/771; H01R 13/6476; H01R 13/02; H01R 13/502; H01R 9/03; H01R 13/6474; H01B 1/00; H05K 1/0237
USPC ........................................ 439/676
See application file for complete search history.

(56) References Cited

U.S. PATENT DOCUMENTS

| 8,038,461 B2* | 10/2011 | Hsu ........... H01R 4/023 439/344 |
| 8,187,040 B2* | 5/2012 | Pepe ........... H01R 24/64 439/676 |
| 9,246,284 B2* | 1/2016 | Wu ........... H01R 13/6474 |

(Continued)

FOREIGN PATENT DOCUMENTS

| CN | 105281081 A | * 1/2016 | ......... H01R 12/7082 |
| CN | 105322383 A | 2/2016 | |
| TW | M517440 U | 2/2016 | |

*Primary Examiner* — Peter G Leigh
(74) *Attorney, Agent, or Firm* — CKC & Partners Co., LLC

(57) ABSTRACT

A cable assembly includes a plurality of wires and a plurality of electrical contacts. The electrical contacts include contact sections and wire connecting sections, and the wire connecting sections of the electrical contacts are respectively connected to the wires. Two adjacent electrical contacts for transmitting signals have a first edge distance and an expanded edge distance. The first edge distance is adjacent to the contact sections, and the expanded edge distance is between the first edge distance and the wire connecting sections. In addition, the first edge distance is smaller than the expanded edge distance to improve signal integrity.

10 Claims, 3 Drawing Sheets

(51) Int. Cl.
*H01R 12/72* (2011.01)
*H01R 13/502* (2006.01)

(56) References Cited

U.S. PATENT DOCUMENTS

| | | | | |
|---|---|---|---|---|
| 9,490,549 B2 * | 11/2016 | Little | ...................... | H01R 12/53 |
| 9,502,841 B2 * | 11/2016 | Little | ...................... | H01R 24/60 |
| 9,711,908 B2 * | 7/2017 | Yao | ..................... | H01R 13/6471 |
| 2010/0216331 A1 * | 8/2010 | Amidon | ............... | H01R 4/2404 |
| | | | | 439/676 |
| 2016/0020558 A1 * | 1/2016 | Yang | ................. | H01R 13/6585 |
| | | | | 439/95 |
| 2016/0149338 A1 * | 5/2016 | Xing | ....................... | B29C 70/84 |
| | | | | 439/449 |
| 2016/0268700 A1 * | 9/2016 | Little | ..................... | H01R 12/53 |
| 2016/0268745 A1 * | 9/2016 | Little | ................. | H01R 13/6273 |

* cited by examiner

CABLE ASSEMBLY WITH IMPROVED HIGH FREQUENCY SIGNAL INTEGRITY AND INCREASE QUALITY WITH HIGH FREQUENCY SIGNAL TRANSMISSION

RELATED APPLICATIONS

This application claims priority to Taiwan Application Serial Number 107137063, filed Oct. 19, 2018, which is herein incorporated by reference.

TECHNICAL FIELD

The present disclosure generally relates to a cable assembly. More particularly, the present disclosure relates to a high frequency cable assembly.

BACKGROUND

With the development and innovation of various high frequency electronic products, new high frequency electronic products require relatively more bandwidth. Therefore, the world today relies on the rapid and reliable information transmission.

As semiconductors continue to break through in technology, the semiconductors have been widely used in the computer bus architecture, network infrastructure, and digital wireless communication. In the computer industry, especially when the speed of the server computer processor has been upgraded to gigahertz (GHz), the memory transmission rate and the internal bus speed are also apparently increased. High-speed data transmission technology can support more powerful computer applications such as 3D games and computer-aided design programs. Advanced 3D images require a large amount of data transmission in the CPU, memory, and display card.

However, computer technology is only one part of the new information and bandwidth era. Digital communication engineers are also gradually adopting higher frequency data transmission technology in the new communication products. At the same time, in the field of digital high-definition video technology, the next generation of high-quality, interactive video equipment is being designed. Various new technologies continue to improve data transmission rates. Emerging serial bus is breaking the bottleneck of parallel bus architectures.

The increasing bandwidth is a challenge for digital system design. In the past, data interactions occurred in milliseconds, but now data interactions are measured in nanoseconds. Therefore, there is a need to more accurately transmit the required signals for an electronic cable at a higher data transmission rate.

SUMMARY

One objective of the embodiments of the present invention is to provide a cable assembly to improve the high frequency signal integrity and further increase the quality and speed of high frequency signal transmission.

To achieve these and other advantages and in accordance with the objective of the embodiments of the present invention, as the embodiment broadly describes herein, the embodiments of the present invention provides an cable assembly including a plurality of wires and a plurality of electrical contacts. The electrical contacts include contact sections, fixing sections and wire connecting sections, the wire connecting sections of the electrical contacts respectively connect to the wires. Two adjacent electrical contacts of the electrical contacts include a first edge distance and an expanded edge distance, the first edge distance is adjacent to the contact sections and the expanded edge distance is located between the first edge distance and the wire connecting sections, and the first edge distance is smaller than the expanded edge distance to improve a signal integrity for the cable assembly.

The cable assembly further includes a fixation device to fix the electrical contacts. In some embodiments, the electrical contacts are held and fixed by the fixation device through a plastic insert molding process.

In some embodiments, the expanded edge distance is a second edge distance located between the fixing sections and the first edge distance.

In some embodiments, the expanded edge distance is a third edge distance located at the fixing sections.

In some embodiments, the expanded edge distance comprises a second edge distance located between the fixing sections and the first edge distance, and a third edge distance located at the fixing sections.

In some embodiments, the two adjacent electrical contacts further include a fourth edge distance located at the wire connecting sections and the first edge distance is equal to the fourth edge distance.

In some embodiments, the two adjacent electrical contacts are a pair of signal transmission electrical contacts.

In some embodiments, the cable assembly further includes a protecting cover. The fixation device fixes the electrical contacts in the protecting cover, and the protecting cover includes a protecting lid and a U-shaped sidewall formed on one side of the protecting lid.

In some embodiments, the protecting cover is a plastic protecting cover and the fixation device is a plastic fixation device.

Hence, the cable assembly can be conveniently coupled to the print circuit board to directly connect to the pads on the print circuit board. In addition, because that the shape of the electrical contacts are changed to improve the signal integrity, the signal integrity of the high frequency signal can be effectively improved more effectively, and furthermore the quality and speed of the high frequency signal transmission are also effectively increased.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
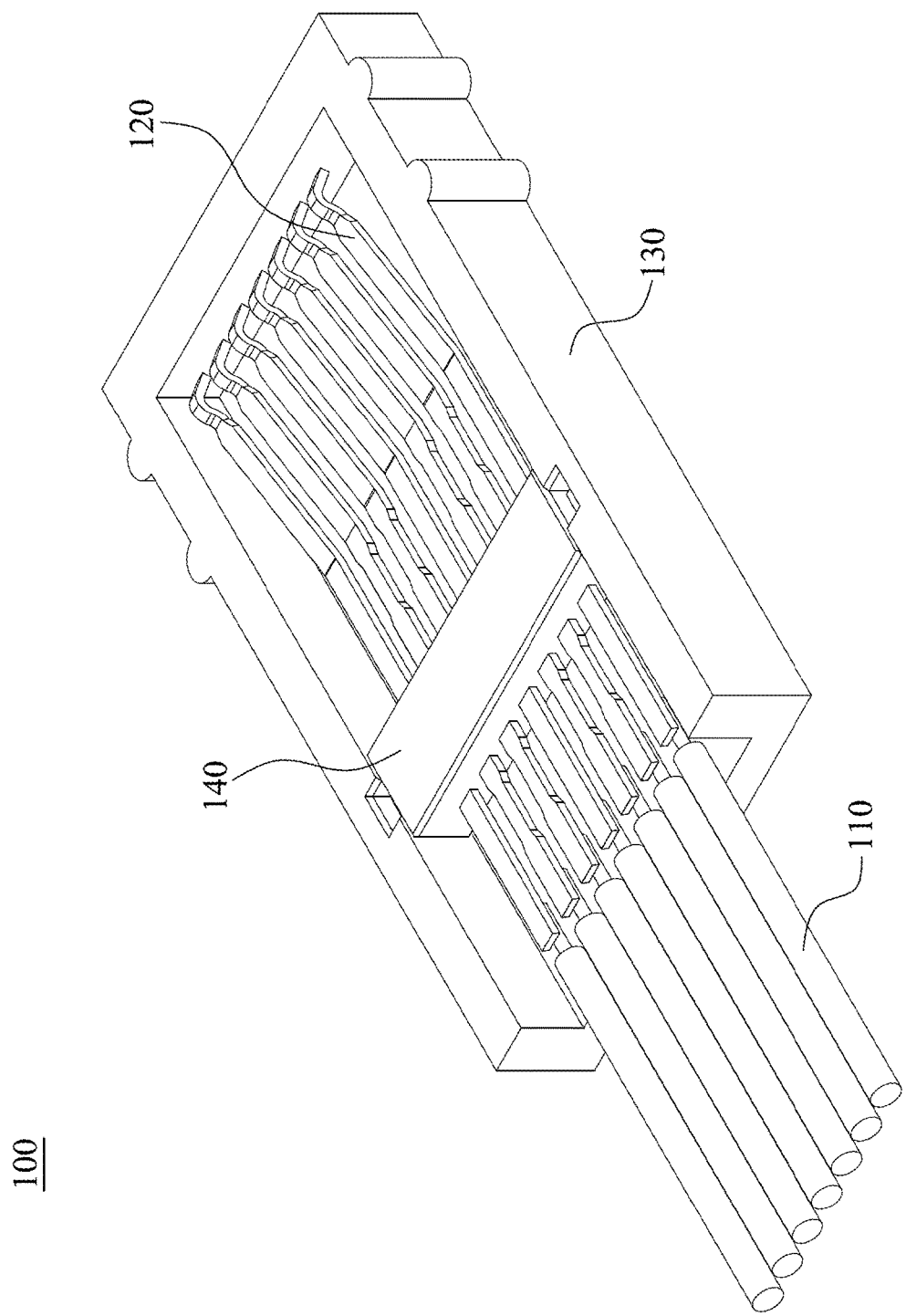
FIG. 1 illustrates a schematic perspective diagram showing a cable assembly according to one embodiment of the present invention.
Figure 2:
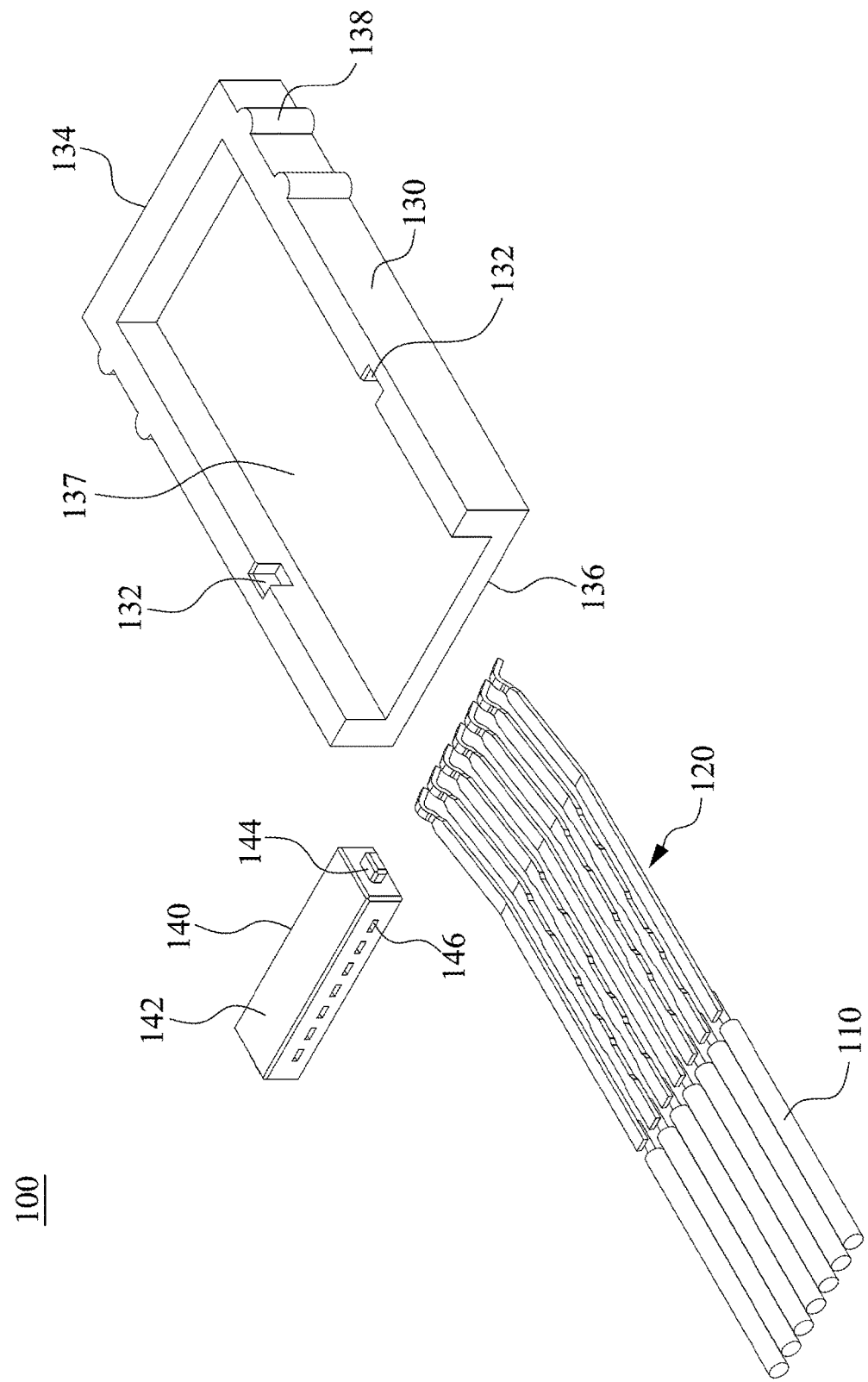
FIG. 2 illustrates a schematic exploded view showing a cable assembly according to one embodiment of the present invention.
Figure 3:
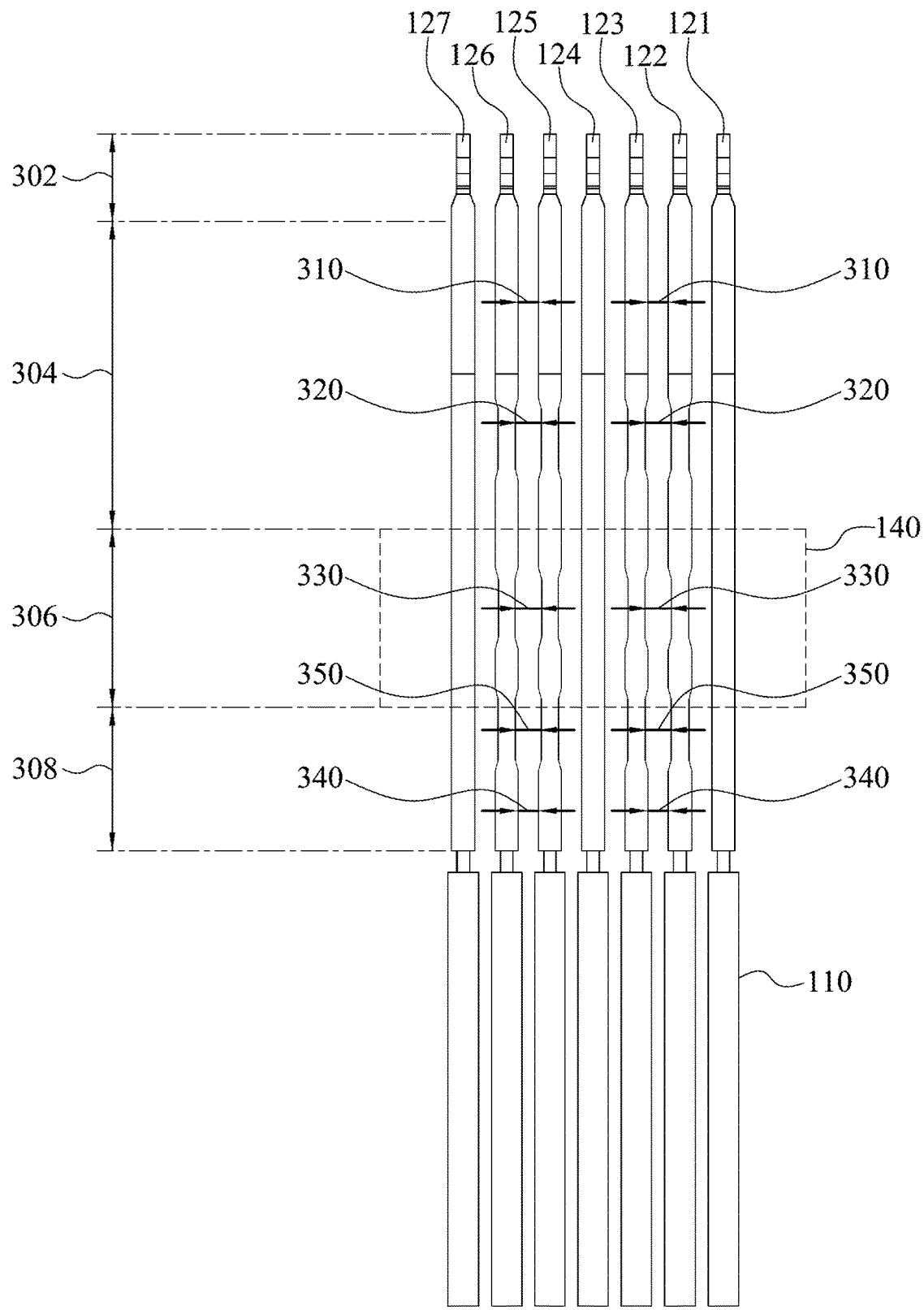
FIG. 3 illustrates a schematic front view showing electrical contacts of a cable assembly according to one embodiment of the present invention.

Refer to FIGS. 1-3. FIG. 1 illustrates a schematic perspective diagram showing a cable assembly according to one embodiment of the present invention, FIG. 2 illustrates a schematic exploded view thereof, and FIG. 3 illustrates a schematic front view of electrical contacts thereof.

As shown in FIG. 1, a cable assembly 100 includes a plurality of wires 110, a plurality of electrical contacts 120, a protecting cover 130 and a fixation device 140.

The wires 110 are respectively fixed to the electrical contacts 120, the electrical contacts 120 are fixed by the fixation device 140, and the fixation device 140, the wires 110 and the electrical contacts 120 are installed in the protecting cover 130.

Simultaneously referring to FIG. 3, the electrical contacts 120 have contact sections 302, exposing sections 304, fixing sections 306 and wire connecting sections 308 in sequence. The contact sections 302 of the electrical contacts 120 are configured to electrically connect to pads, e.g. golden fingers, of a print circuit board, e.g. a mother board.

The wire connecting sections 308 of the electrical contacts 120 are electrically connected to the wires 110 by, for example, welding or the like.

The electrical contact 120 includes, for example, a first ground electrical contact 121, a first signal electrical contact 122, a second signal electrical contact 123, a second ground electrical contact 124, a third signal electrical contact 125, a fourth signal electrical contact 126 and a third ground electrical contact 127. The first signal electrical contact 122 and the second signal electrical contact 123 are configured to form a pair of signal transmission electrical contacts, the third signal electrical contact 125 and the fourth signal electrical contact 126 are configured to form another pair of signal transmission electrical contacts.

When a conventional cable assembly transmits high frequency signals, for example, 5 GHz (gigahertz) signals or above, parallel electrical contacts with an equal edge distance and material of the electrical contacts may affect the signal integrity (SI) of the signals so as to reduce the signal transmitting quality and speed.

Therefore, the cable assembly 100 adjusts the edge distance of two adjacent electrical contacts 120, e.g. the first signal electrical contact 122 and the second signal electrical contact 123, and/or the third signal electrical contact 125 and the fourth signal electrical contact 126, to improve the signal integrity (SI) so as to effectively improve the signal transmitting quality and speed.

In some embodiments, the first signal electrical contact 122 and the second signal electrical contact 123, and the third signal electrical contact 125 and the fourth signal electrical contact 126 respectively includes a first edge distance 310, a second edge distance 320, a third edge distance 330, a fourth edge distance 340 and a fifth edge distance 350.

The second edge distance 320, the third edge distance 330 and the fifth edge distance 350 are expanded edge distances which are larger than the first edge distance 310 and the fourth edge distance 340 to improve the signal integrity (SI) and further effectively improve the signal transmitting quality and speed.

Measuring positions of the first edge distance 310 are located in the exposing sections 304, and the measuring positions of the first edge distance 310 are adjacent to the contact sections 302 and located between the fixing sections 306 and the contact sections 302. That is to say, the first edge distance 310 is a distance between edges, adjacent to the contact sections 302 and located between the fixing sections 306 and the contact sections 302, of the exposing sections 304 of the first signal electrical contact 122 and the second signal electrical contact 123, or a distance between edges, adjacent to the contact sections 302 and located between the fixing sections 306 and the contact sections 302, of the exposing sections 304 of the third signal electrical contact 125 and the fourth signal electrical contact 126.

In addition, Measuring positions of the second edge distance 320 are located at the exposing sections 304 and close to the fixing sections 306. That is to say, the second edge distance 320 is a distance between edges, close to the fixing sections 306, of the exposing sections 304 of the first signal electrical contact 122 and the second signal electrical contact 123, or a distance between edges, close to the fixing sections 306, of the exposing sections 304 of the third signal electrical contact 125 and the fourth signal electrical contact 126.

It can be seen through experiment that when the second edge distance 320 is larger than the first edge distance 310, the signal integrity of the signal transmission of the first signal electrical contact 122 and the second signal electrical contact 123, and the signal integrity of the signal transmission of the third signal electrical contact 125 and the fourth signal electrical contact 126 can be effectively improved, and the quality and speed of signal transmission thereof are increased.

Furthermore, the third edge distance 330 is located in the fixing sections 306, that is to say, the third edge distance 330 is a distance, measured in the fixing sections 306, between the edge of the first signal electrical contact 122 and the edge of the second signal electrical contact 123, or a distance, measured in the fixing sections 306, between the edge of the third signal electrical contact 125 and the edge of the fourth signal electrical contact 126.

It can be also seen through experiment that when the third edge distance 330 is larger than the first edge distance 310, the signal integrity of the signal transmission of the first signal electrical contact 122 and the second signal electrical contact 123, and the signal integrity of the signal transmission of the third signal electrical contact 125 and the fourth signal electrical contact 126 can be effectively improved, and the quality and speed of signal transmission thereof are increased.

Furthermore, the fourth edge distance 340 is located in the wire connecting sections 308, that is to say, the fourth edge distance 340 is a distance, measured in the wire connecting sections 308, between the edges of the first signal electrical contact 122 and the second signal electrical contact 123, or a distance, measured in the wire connecting sections 308, between the edges of the third signal electrical contact 125 and the fourth signal electrical contact 126. In some embodiments, the first edge distance 310 is approximately equal to the fourth edge distance 340, and smaller than the second edge distance 320 and the third edge distance 330, to improve the signal integrity of the signal transmission, and the quality and speed of signal transmission thereof are increased.

In some embodiments, the fifth edge distance 350 is located in the wire connecting sections 308, that is to say, the fifth edge distance 350 is a distance, measured in the wire connecting sections 308, between the edges of the first signal electrical contact 122 and the second signal electrical contact 123, or a distance, measured in the wire connecting sections 308, between the edges of the third signal electrical contact 125 and the fourth signal electrical contact 126. In addition, the fifth edge distance 350 is located between the fixing section 306 and the fourth edge distance 340.

In some embodiments, an edge distance located at an area between the second edge distance 320 and the third edge distance 330 is approximately equal, and an edge distance located at an area between the third edge distance 330 and the fifth edge distance 350 is approximately equal to improve the signal integrity of the signal transmission, and the quality and speed of signal transmission thereof are increased.

It can be also seen through experiment that when the fifth edge distance 350 is larger than the first edge distance 310, the signal integrity of the signal transmission of the first signal electrical contact 122 and the second signal electrical contact 123, and the signal integrity of the signal transmission of the third signal electrical contact 125 and the fourth signal electrical contact 126 can be effectively improved, and the quality and speed of signal transmission thereof are increased.

In some embodiments, the fixation device 140 is configured to fix the electrical contacts 120 by, for example, plastic insert molding to hold and fix the fixing sections 306 of the electrical contacts 120, and further fix the electrical contacts 120 in the electrical contact fixing hole 146 of the fixation device main body 142, as well as the wires 110 are separately welded to the wire connecting sections 308 of the electrical contacts 120 and a fixing protrusion 144 of the fixation device main body 142 is fixed in a fixing indentation 132 of the protecting cover 130 so that the fixation device 140, the wires 110 and the electrical contacts 120 are positioned and installed in the protecting cover 130.

The protecting cover 130 includes a protecting lid 136 and a U-shaped sidewall 134 formed on one side of the protecting lid 136 to effectively protect the electrical contacts 120 in an accommodating groove 137 and allow the electrical contacts 120 exposing on one side opposite to the protecting lid 136 of the protecting cover 130 to connect to pads on a printed circuit board.

In some embodiments, the protecting cover 130 and the fixation device 140 are a plastic protecting cover and a plastic fixation device.

In some embodiments, the protecting cover 130 further includes a positioning protrusion 138 to couple to a fixing device on a circuit board to exactly connect the electrical contacts 120 to the pads on the circuit board.

In some embodiments, the expanded edge distance can be formed at any positions of the electrical contacts, for example, wire connecting sections or the like. In addition, a plurality of expanded edge distances can be formed in the contact sections, the exposing sections, the fixing sections or the wire connecting sections of the electrical contacts without departing from the spirit and scope of the present application.

Accordingly, the cable assembly can be conveniently coupled to the print circuit board to directly connect to the pads on the print circuit board. In addition, because that the shape of the electrical contacts are changed to improve the signal integrity, the signal integrity of the high frequency signal can be effectively improved more effectively, and furthermore the quality and speed of the high frequency signal transmission are also effectively increased.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A cable assembly, comprising;
a plurality of wires;
a plastic molding piece, having a plurality of electrical contact fixing holes; and
a plurality of electrical contacts arranged in parallel, wherein each of the electrical contacts sequentially comprises:
a contact section;
an exposing section, exposed from the plastic molding piece, having at least one first neck portion;
a fixing section, covered by and disposed in the plastic molding piece, the fixing sections of the plurality of electrical contacts being fixed in the plurality of electrical contact fixing holes respectively, having at least one second neck portion; and
a wire connecting section, exposed from the plastic molding piece, an end of each of the wire connecting sections connecting to one of the wires respectively, the wire connecting section having at least one third neck portion;
wherein
both of the first neck portions of two adjacent electrical contacts are disposed in parallel so as to form a first expanded gap therebetween,
both of the second neck portions of two adjacent electrical contacts are disposed in parallel so as to form a second expanded gap therebetween,
both of the third neck portions of two adjacent electrical contacts are disposed in parallel so as to form a third expanded gap therebetween.

2. The cable assembly of claim 1, wherein the plastic molding piece is configured to fix the electrical contacts.

3. The cable assembly of claim 2, wherein the electrical contacts are held and fixed by the plastic molding piece through a plastic insert molding process.

4. The cable assembly of claim 2, further comprising a protecting cover, wherein the plastic molding piece fixes the electrical contacts in the protecting cover, and the protecting cover comprises a protecting lid and a U-shaped sidewall formed on one side of the protecting lid.

5. The cable assembly of claim 4, wherein the protecting cover is a plastic protecting cover.

6. The cable assembly of claim 1, wherein a width of the first expanded gap, a width of the second expanded gap and a width of the third expanded gap are approximately the same.

7. The cable assembly of claim 1, wherein the two adjacent electrical contacts are a pair of signal transmission electrical contacts.

8. The cable assembly of claim 1, further comprising a protecting cover, having an accommodating groove for the contact section, the exposing sections and the wire connecting section of the plurality of electrical contacts to be exposed from the protecting cover.

9. The cable assembly of claim 8, wherein a bottom wall of the protecting cover covering the contact section, the exposing section and the fixing section of the plurality of electrical contacts entirely and the bottom wall has no through hole formed thereon.

10. The cable assembly of claim 8, wherein all of the electrical contacts in the cable assembly is arranged in a same row.

* * * * *